United States Patent
Hobson et al.

(10) Patent No.: US 9,651,999 B1
(45) Date of Patent: May 16, 2017

(54) ELECTRONIC DEVICE WITH RADIALLY DEPLOYED COMPONENTS

(71) Applicant: Apple Inc., Cupertino, CA (US)

(72) Inventors: Phillip Michael Hobson, Menlo Park, CA (US); Nathan P. Bosscher, Campbell, CA (US); John J. Baker, Cupertino, CA (US); Craig M. Stanley, Campbell, CA (US); Brad G. Boozer, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/720,538

(22) Filed: May 22, 2015

Related U.S. Application Data

(60) Provisional application No. 62/057,840, filed on Sep. 30, 2014.

(51) Int. Cl.
| | |
|---|---|
| *H05K 7/00* | (2006.01) |
| *G06F 1/18* | (2006.01) |
| *H05K 5/02* | (2006.01) |
| *G06F 1/16* | (2006.01) |
| *G06F 1/20* | (2006.01) |

(52) U.S. Cl.
CPC ............ *G06F 1/181* (2013.01); *G06F 1/1684* (2013.01); *G06F 1/1686* (2013.01); *G06F 1/1688* (2013.01); *G06F 1/182* (2013.01); *G06F 1/20* (2013.01); *H05K 5/02* (2013.01); *H05K 5/0217* (2013.01)

(58) Field of Classification Search
CPC .... G06F 1/1601; G06F 1/1609; G06F 1/1613; G06F 1/1615; G06F 1/1603; G06F 1/1605; G06F 1/1607; G06F 1/181; G06F 1/182; G06F 1/20; G06F 1/1684; G06F 1/1686; G06F 1/1688; G06F 1/1656; G06F 1/1658; G02B 6/0001
USPC ..... 361/679.01–679.45, 679.55–679.59, 728
See application file for complete search history.

(56) References Cited

U.S. PATENT DOCUMENTS

| | | | | |
|---|---|---|---|---|
| 4,179,177 | A | 12/1979 | Lapraik | |
| 5,060,111 | A * | 10/1991 | Takashima | G06F 13/409 165/80.3 |
| 5,889,651 | A * | 3/1999 | Sasaki | G01R 31/2891 165/908 |
| 6,519,349 | B1 * | 2/2003 | Azima | B42D 15/022 381/152 |
| 6,798,191 | B1 * | 9/2004 | Macfarlane | G01R 22/065 324/156 |
| 7,733,651 | B2 | 6/2010 | Hogg et al. | |

(Continued)

*Primary Examiner* — Nidhi Thaker
(74) *Attorney, Agent, or Firm* — Kilpatrick, Townsend & Stockton LLP

(57) ABSTRACT

An array of electrical components may be mounted in openings in an electronic device housing. Gaskets may be used to seal the electrical components to a housing wall. The housing wall may be planar or may have a cylindrical shape or other curved shape. A support structure such as a hollow tube may be mounted within the interior of a cavity region defined by the housing wall. The electrical components may be radially deployed into the openings. Mating ramped structures may be translated with respect to each other to push elongated strips of components outward or each electrical component may be pushed outward using a threaded nut that engages threads on the electrical component.

22 Claims, 16 Drawing Sheets

(56) References Cited

U.S. PATENT DOCUMENTS

| | | | |
|---|---|---|---|
| 8,227,692 B2 * | 7/2012 | Dahlgren | G01D 11/24 |
| | | | 174/50 |
| 8,573,911 B2 | 11/2013 | Degner et al. | |
| 9,496,668 B1 * | 11/2016 | Baker | H01R 35/02 |
| 2009/0293656 A1 * | 12/2009 | Liu | H04N 5/2252 |
| | | | 74/110 |
| 2010/0002383 A1 * | 1/2010 | Yeh | G06F 1/181 |
| | | | 361/695 |
| 2013/0168336 A1 | 7/2013 | Kim et al. | |

* cited by examiner

ELECTRONIC DEVICE WITH RADIALLY DEPLOYED COMPONENTS

This application claims the benefit of provisional patent application No. 62/057,840, filed Sep. 30, 2014, which is hereby incorporated by reference herein in its entirety.

BACKGROUND

This relates generally to electronic devices, and more particularly, to electronic devices with electronic components mounted to device housings.

Electronic devices include electronic components. Some components such as integrated circuits and batteries are mounted within interior portions of electronic device housings. Other components are mounted on the exteriors of housings. For example, components that emit or receive light or sound are often mounted in exposed locations on housings to facilitate proper operation of the components in supplying output and receiving input.

In some device designs, it may be desirable to mount multiple components in an array. For example, some electronic components benefit from operation as a coordinated group. It may be helpful in such arrangements to mount components in close proximity to each other. If care is not taken, components may be damaged during installation, damage may be created to the housing to which the components are being mounted, components may be difficult to repair when faults are detected, or components may consume more space within a device than desired.

It would be desirable to be able to address these challenges with a mounting scheme that is suitable for use when mounting components in a variety of housings.

SUMMARY

An electronic device may have a housing wall. An array of electrical components may be mounted in a corresponding array of openings in the housing wall. The components may be audio components, light-based components, sensors, or other electrical components. Gaskets may be used to seal the electrical components to the housing wall.

The housing wall may be planar or may be curved. Curved housing walls may have cylindrical shapes to form cylindrical housings. The array of openings in the housing may cover some or all of the surface of the cylindrical housing wall.

A cylindrical support structure may be mounted within the interior of a cylindrical housing. The electrical components may be radially deployed into the openings using radial deployment structures. The radial deployment structures may include mating ramped structures that are translated with respect to each other to push elongated strips of components outward or may include threaded nut deployment structures that engage threads on electrical components to push the electrical components outward.

DETAILED DESCRIPTION

Electronic devices may include components. The components may be light-based components, audio components, sensors, or other electrical components. The components may be mounted within the interior of an electronic device and/or may be mounted on the exterior of an electronic device. Configurations in which electrical components are exposed on the exterior of a housing may facilitate signal input and output operations using the components (e.g., input and output operations involving light signals, acoustic signals, temperature information, etc.). Accordingly, configurations in which components are mounted within openings in housing surfaces are sometimes described herein as an example.

In some devices, it may be desirable to mount multiple components in proximity to each other. For example, optical components may be mounted in proximity to each other to form a display with an array of pixels or to form other types of light output devices (e.g., a light-based status indicator), speakers may be mounted in an array to form a phased speaker array or to provide enhanced output levels, microphones may be mounted in an array to gather audio information from multiple directions, proximity sensors may be mounted in an array to create a touch or motion input device that can capture input from a user's hand or other external object, and other sensors and input-output components may be mounted in arrays to enhance the ability of an electronic device to gather input and provide output.

Multiple components may be mounted adjacent to one another in a regular array having one or more rows and one or more columns of electrical components. Components may also be organized in a less regular fashion such as a pseudorandom pattern on the surface of a device housing.

Illustrative electronic devices that may be provided with components are shown in FIGS. 1, 2, 3, 4, and 5.

Figure 1:
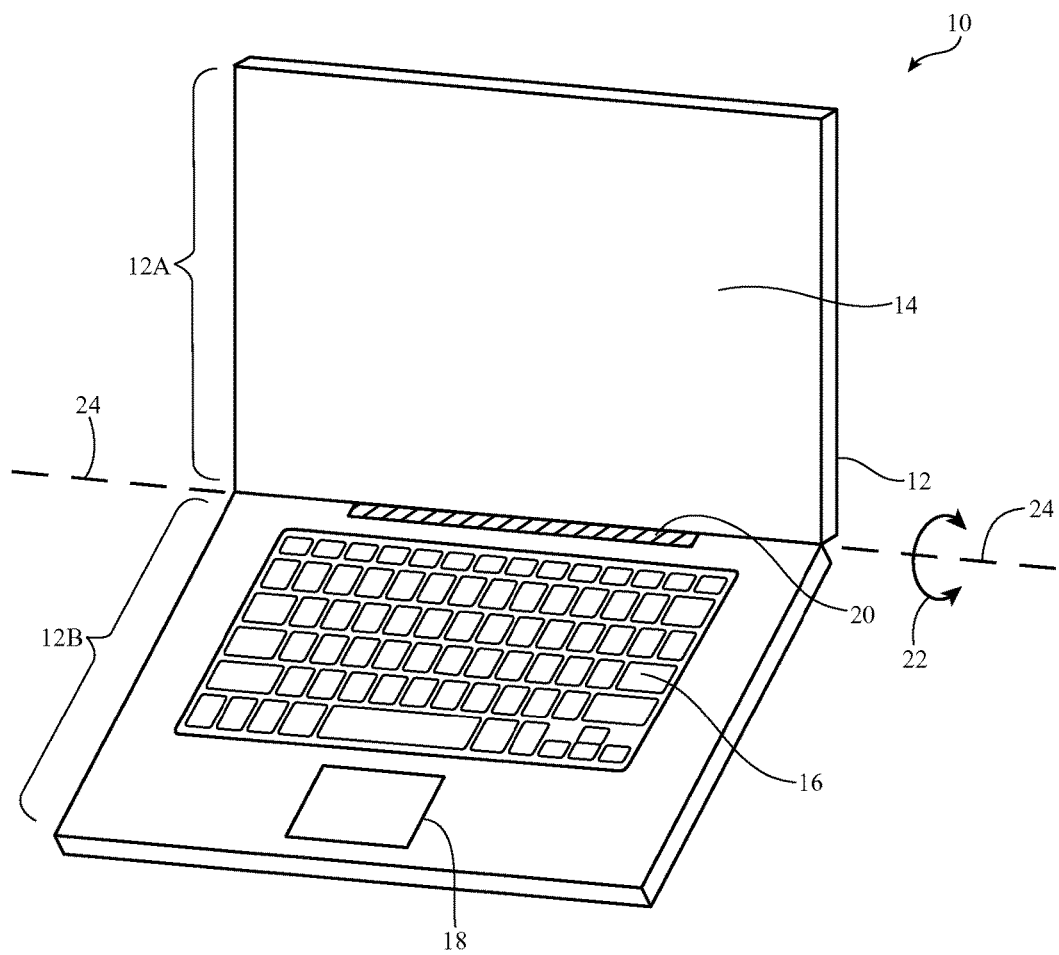
FIG. 1 is a perspective view of an illustrative electronic device such as a laptop computer in accordance with an embodiment.

Illustrative electronic device 10 of FIG. 1 has the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes be referred to as a display housing or lid, may be placed in a closed position by rotating upper housing 12A towards lower housing 12B about rotational axis 24.

Figure 2:
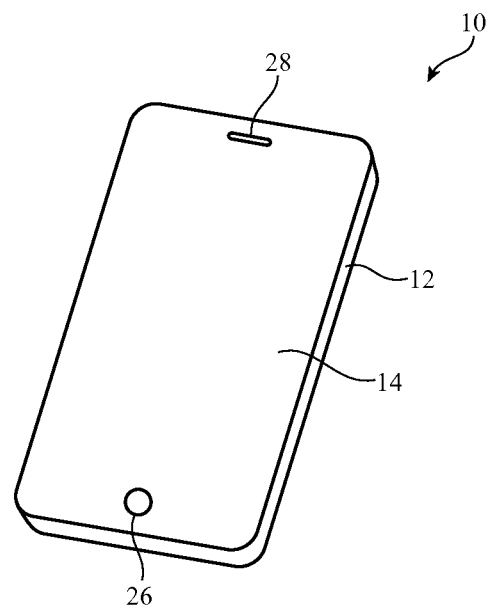
FIG. 2 is a perspective view of an illustrative electronic device such as a handheld electronic device in accordance with an embodiment.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have openings for components such as button 26. Openings may also be formed in display 14 to accommodate a speaker port (see, e.g., speaker port 28 of FIG. 2).

Figure 3:
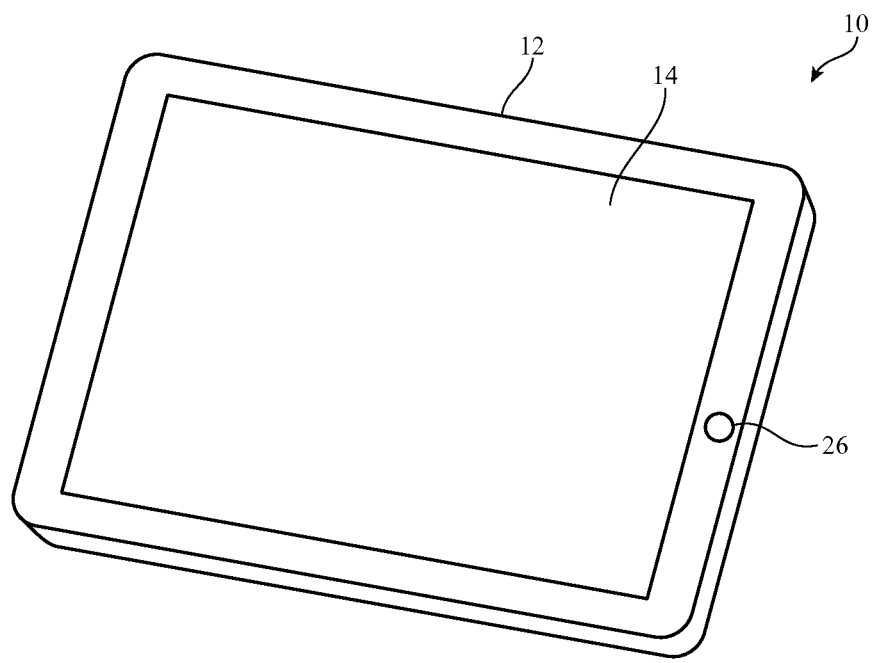
FIG. 3 is a perspective view of an illustrative electronic device such as a tablet computer in accordance with an embodiment.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have an opening to accommodate button 26 (as an example).

Figure 4:
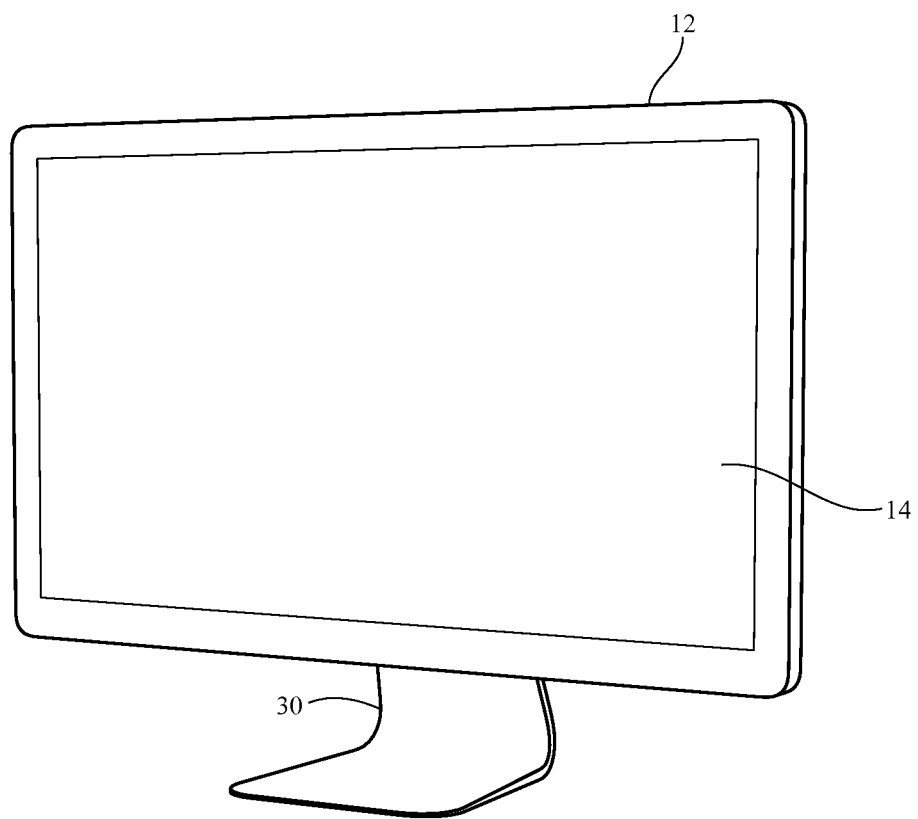
FIG. 4 is a perspective view of an illustrative electronic device such as a computer display in accordance with an embodiment.

FIG. 4 shows how electronic device 10 may be a computer display, a computer that has been integrated into a computer display, or a display for other electronic equipment. With this type of arrangement, housing 12 for device 10 may be mounted on a support structure such as stand 30 or stand 30 may be omitted (e.g., stand 30 can be omitted when mounting device 10 on a wall). Display 14 may be mounted on a front face of housing 12.

Figure 5:
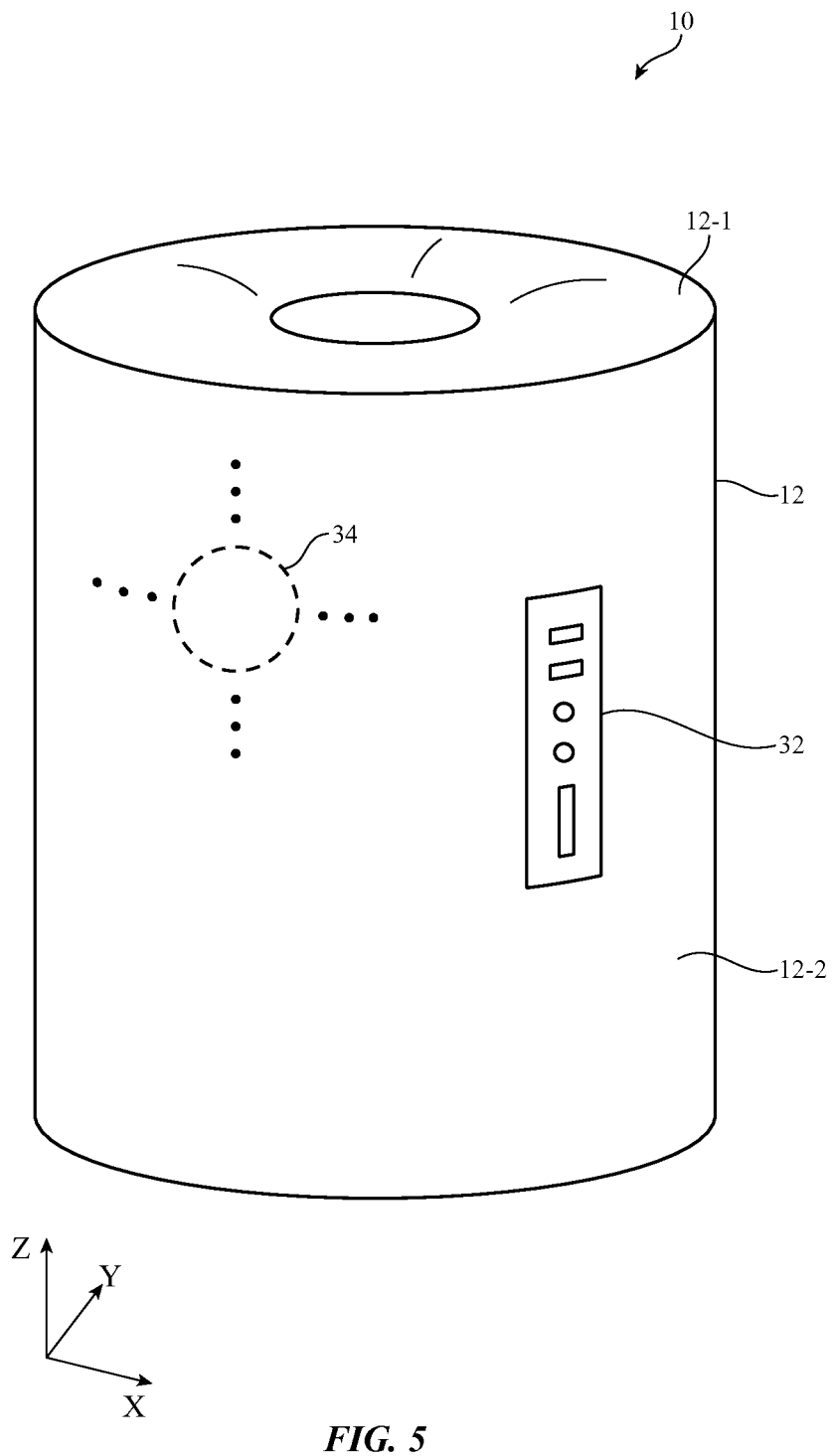
FIG. 5 is perspective of an illustrative electronic device such as a computing device or other device with a cylindrical housing that surrounds an interior region and that is surrounded by an exterior region in accordance with an embodiment.

FIG. 5 shows how electronic device 10 may have a cylindrical housing. Device 10 may be, for example, a desktop computer such as the Mac Pro computer available from Apple Inc. of Cupertino, Calif. Housing 12 may have an input-output connector region such as region 32 that contains input-output connectors (e.g., Universal Serial Bus connectors and other digital signal connectors, power connectors, audio connectors, memory card slots, and other input-output connectors). Upper surface 12-1 of housing 12 may be planar or may have curved surfaces (as shown in FIG. 5). Sidewall 12-2 of housing 12 may have a curved surface so that housing 12 has a cylindrical shape (as an example). Housing 12 may also have other shapes (e.g., conical shapes, pyramidal shapes with curved and/or planar sidewall surfaces, spherical housing shapes, other shapes, and combinations of these shapes).

Housing 12 may have a vertical dimension (height in dimension Z) that is larger than its lateral (horizontal) dimensions (i.e., widths in dimensions X and Y). Configurations in which housing 12 is shorter in height and wider in width may also be used. If desired, part of housing 12 may be cylindrical and part of housing 12 may have one or more planar sidewalls. For example, housing 12 may have the shape of a half cylinder in which the front portion of housing 12 has a cylindrical shape and the rear portion of housing 12 has a planar rear housing wall. Other shapes with cylindrical surfaces may also be used (e.g., quarter cylinders, three-quarter cylinders, etc.). Display 14 may be mounted in housing 12 or may be omitted from device 10 of FIG. 5.

The illustrative configurations for device 10 that are shown in FIGS. 1, 2, 3, 4, and 5 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, an accessory such as a charging station, a stand for a display, speaker or other electronic device, an alarm clock, a speaker, a docking station, an amplifier, a projector, a camera, a video camera, gaming equipment, a television cable box or other set-top box, lighting equipment, a motion sensor, a touch pad or other input-output device that gathers data from a touch sensor(s), networked attached storage or other data storage device, a wireless access point, a router, or other network equipment, other equipment, or equipment that implements the functionality of two or more of these devices.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 may include display pixels formed from liquid crystal display (LCD) components, organic light-emitting diode pixels, or other suitable image pixel structures. If desired, display 14 may be omitted from device 10 (e.g., to conserve space) or multiple displays such as display 14 may be included in device 10 (e.g., in an array). Light-based status indicators and other input-output devices may be used to supplement information displayed on display 14 or may be used to provide a user with status information and other output when display 14 has been omitted.

If desired, one or more electrical components may be mounted on housing 12. For example, a single component or an array of components may be mounted in the position(s) of illustrative component(s) 34 of FIG. 5 or elsewhere on housing 12 of FIG. 1, 2, 3, 4, or 5 or on other electronic device housings. Electrical components 34 may be mounted on a planar housing wall or a curved housing wall. Components 34 may, for example, be mounted an a surface of housing 12 where housing 12 has a non-planar surface such as where housing wall 12-2 of FIG. 5 is curved (e.g., curved on the side of a cylinder). In general, components 34 may be mounted on a curved surface such as a corner of a housing, a rounded edge of a housing, a curved sidewall, a curved front wall, a curved rear wall of housing 12, a curved top wall, etc. Configurations in which housing 12 has a cylindrical surface on which components 34 are mounted in an array (e.g., configurations of the type shown in FIG. 5 in which components 34 are mounted in an array on some or all of curved cylindrical outer surface 12-2 of housing 12) are sometimes described herein as an example.

The electrical components that are mounted to housing 12 such as components 34 of FIG. 5 may be electrical components such as light-emitting diodes, lamps, displays, lasers, or other light-emitting components, may be vibrators, buzzers, speakers, tone-generators, microphones, or other acoustic components, may be sensors such as touch sensors, temperature sensors, accelerometers, compasses, gyroscopes, position sensors, proximity sensors, or may be other suitable electronic components.

Figure 6:
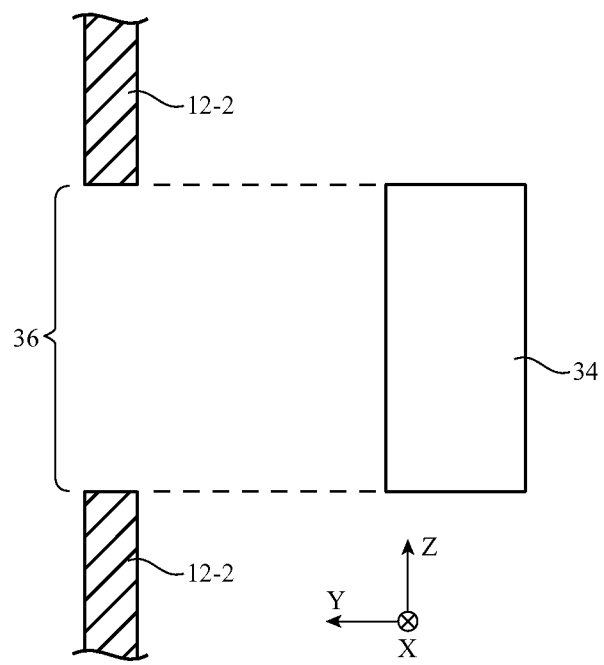
FIG. 6 is a cross-sectional side view of an illustrative electronic component being mounted in an opening in a device housing in accordance with an embodiment.

As shown in FIG. 6, each component 34 may be mounted in a respective opening in housing wall 12-2 such as opening 36. Component 34 may be mounted from the exterior of device 10 or from the interior of housing 12. After component 34 has been placed within opening 36, fasteners or other suitable attachment mechanisms (e.g., clips, adhesive, springs, other engagement features, etc.) may be used in securing component 34 to housing wall 12-2.

Figure 7:
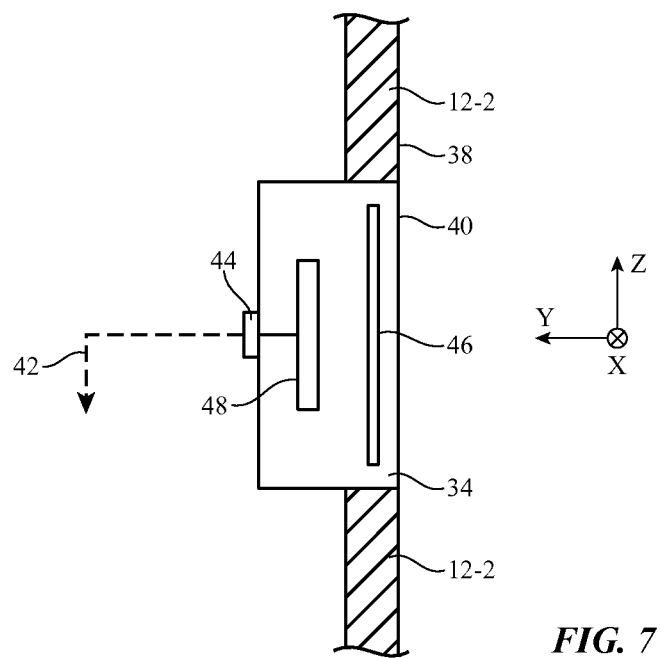
FIG. 7 is a cross-sectional side view of the illustrative electronic component of FIG. 6 following mounting of the component to the device housing in accordance with an embodiment.

As shown in FIG. 7, component 34 may be mounted so that some or all of exterior component surface 40 is flush (or nearly flush) with outer surface 38 of housing wall 12-2. In configurations in which housing wall 12-2 is curved (e.g., when wall 12-2 forms part of a cylinder), external component surface 38 may have a matching curved surface (e.g., some or all of the curvature of surface 40 of component 34 may match (or nearly match) the curvature of housing wall surface 38.

Electrical components 34 may be coupled to control circuitry using signal paths such as signal path 42 of FIG. 7. Signal path 42 may include one or more conductive lines on printed circuits or other substrates, wires, optical fibers, light-pipes, cables, plastic carriers with metal traces or other electrical signal lines, or other signal paths. The electrical and/or optical paths that are coupled to components 34 may be used to carry power signals, digital and/or analog signals (e.g., control signals, image data, audio signals, sensor information, etc.), or other signals.

Connectors such as connector 44 of FIG. 7 may be used to facilitate attachment of the electrical components to signal path 42. For example, components 34 may each have a respective connector such as connector 44 of FIG. 7 that mates with a corresponding connector on an optical and/or electrical cable or other signal path 42. Connector 44 may be a zero insertion force cable or other printed circuit connector, may be a coaxial connector or other rotationally symmetric connector for audio and/or radio-frequency signals, may be a power connector, may be a Universal Serial Bus connector or other digital data connector, may be an Ethernet connector, may be an audio connector, may be an optical connector, may be a male connector, may be a female connector, may be a locking connector, may be an reversible (orientation independent) connector with two or more operating positions, or may be any other suitable connector. If desired, connector 44 may have mating contacts that can be coupled and decoupled without using a fixed connection such as a solder or conductive adhesive connection Alternatively, connections between component 34 and a signal path may be made by using solder or conductive adhesive to join mating contacts (e.g., contacts on components 34 and mating contacts on a cable, printed circuit substrate, or other carrier with metal traces or other electrical signal lines).

Components such as component 34 of FIG. 7 may contain subcomponents such as subcomponents 46 and 48. Subcomponent 46 may be located near the front face of component 34 and may be a lens or lens system (e.g., when component 34 is an optical component), may be a diaphragm or speaker grill (e.g., when component 34 is a speaker), may be a microphone diaphragm, may be an optically or acoustically transparent window structure, may be a dielectric member (e.g., to form a window that allows electromagnetic signals for a sensor to pass through the window), may be a thermally conductive member that allows heat to pass into component 34, or may be other suitable front-of-component subcomponent. Subcomponent 48 may be a light source such as a light-emitting diode, laser, or lamp, may be a light detector such as an image sensor or photodetector, may be a speaker driver (e.g., a driver that drives a diaphragm), may be a temperature sensor such as a solid state temperature sensor or a thermocouple, may be a motion sensor, capacitive sensor, or other type of sensor, or may be other suitable electrical subcomponent for supporting the operation of component 34.

Figure 8:
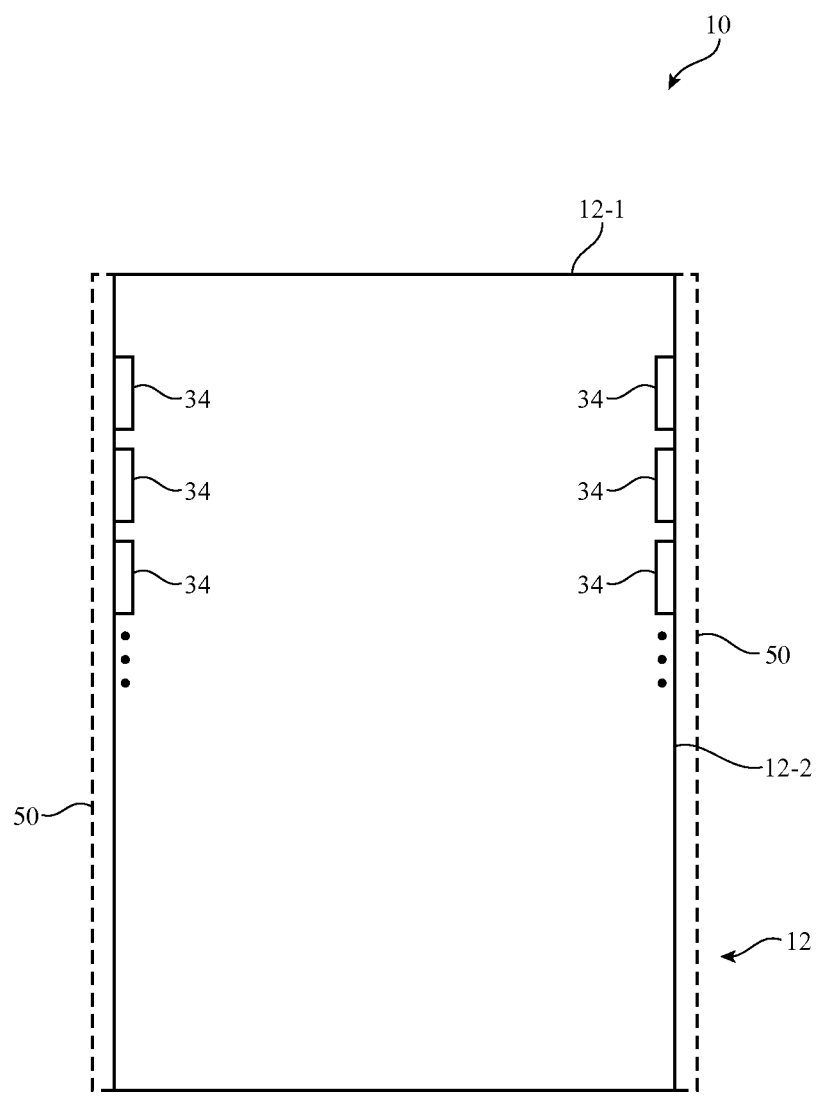
FIG. 8 is a cross-sectional side view of an electronic device showing how an array of components may be mounted to the exterior of a device housing in accordance with an embodiment.

If desired, components 34 may be mounted in a continuous (or nearly continuous) array of rows and columns on the outer curved surface of cylindrical housing wall 12-2, as shown in the illustrative cross-sectional side view of device 10 in FIG. 8. Components 34 may also be mounted on internal housing structures and/or walls such as upper wall 12-1. An optional covering such as covering 50 may be used to cover components 34. Covering 50 may be acoustically transparent (e.g., covering 50 may be a plastic mesh and/or metal mesh or other cover with openings to allow sound to pass), may be optically transparent (e.g., by using a transparent or semi-transparent material or pattern of material such as frosted glass, plastic with a thin semitransparent coating or patterned coating layer), may be sufficiently thermal conductive to allow temperature measurements to be made through covering 50 (e.g., a thin metal cover), or may be any other suitable covering structure for improving device aesthetics, enhancing component protection, etc.

There may be any suitable number of components 34 in the array of components on wall 12-2 (e.g., one or more, two or more, five or more, 10 or more, 20 or more, 50 or more 2-200, 5-150, 20-100, less than 100, less than 50, less than 300, less than 20, 20-70, 20-100, or other suitable number). The distance between adjacent components 34 may be less than 10 mm, 2-5 mm, less than 20 mm, more than 3 mm, between 1-15 mm, less than 5 mm, etc.

Figure 9:
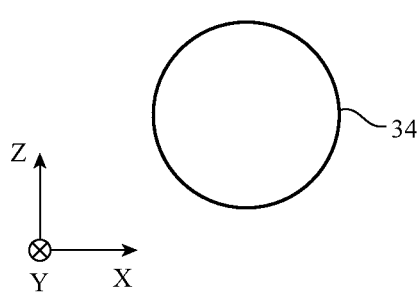
FIG. 9 is a front view of an illustrative electronic component with a circular outline in accordance with an embodiment.
Figure 10:
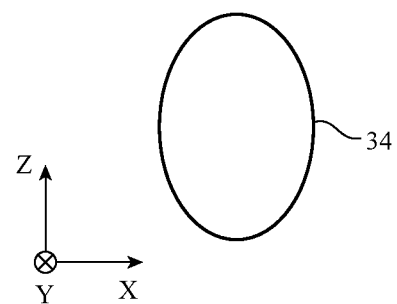
FIG. 10 is a front view of an illustrative electronic component with an oval outline in accordance with an embodiment.
Figure 11:
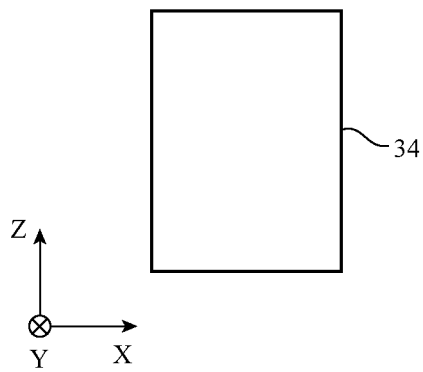
FIG. 11 is a front view of an illustrative electronic component with a rectangular outline in accordance with an embodiment.
Figure 12:
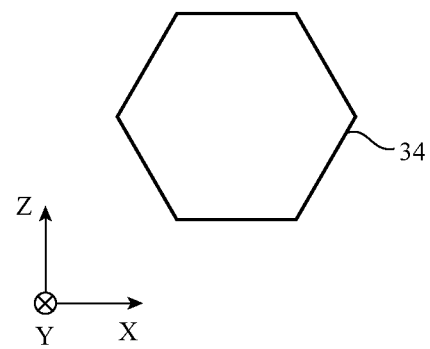
FIG. 12 is a front view of an illustrative electronic component with a hexagonal outline in accordance with an embodiment.

Components 34 may have any suitable shapes such as box shapes, frustoconical shapes (e.g., frustoconical shapes with planar and/or curved ends), pyramidal shapes, shapes with front surfaces that are wider than their opposing rear surfaces, shapes with curved edges and/or straight edges, shapes with curved front surfaces, etc.), cone shapes, step-wise varying cone shapes, spherical shapes, disk shapes, shapes with combinations of curved and straight edges and planar and/or curved sidewalls, etc.). FIGS. 9, 10, 11, and 12 are front views of illustrative shapes that may be used for components 34. In the example of FIG. 9, component 34 has a circular outline when viewed from the front (i.e., when viewed from the exterior of device 10 when component 34 has been mounted in housing sidewall 12-2). In the example of FIG. 10, component 34 has an oval outline when viewed from the front. FIG. 11 shows how component 34 may have a rectangular outline when viewed from the front. In the illustrative configuration of FIG. 12, component 34 has a hexagonal shape when viewed from the front. Other shapes may be used for component 34 if desired. The examples of FIGS. 9, 10, 11, and 12 are merely illustrative.

Figure 13:
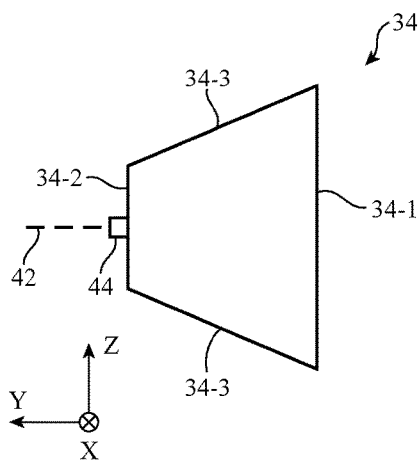
FIG. 13 is a cross-sectional side view of an illustrative electronic component with a trapezoidal cross section in accordance with an embodiment.
Figure 14:
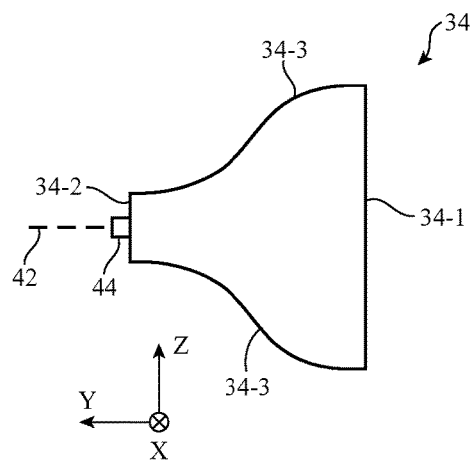
FIG. 14 is a cross-sectional side view of an illustrative electronic component with a smoothly tapered cross section in accordance with an embodiment.
Figure 15:
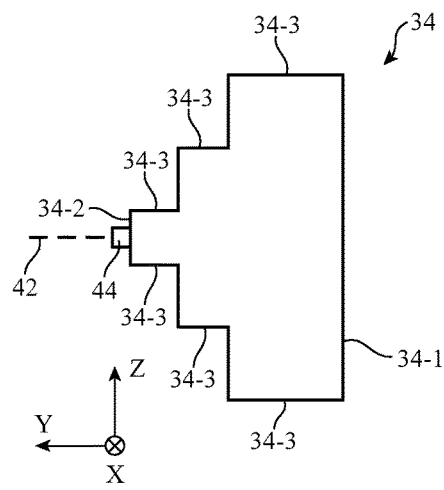
FIG. 15 is a cross-sectional side view of an illustrative electronic component with a cross section that is tapered in a step-wise fashion in accordance with an embodiment.
Figure 16:
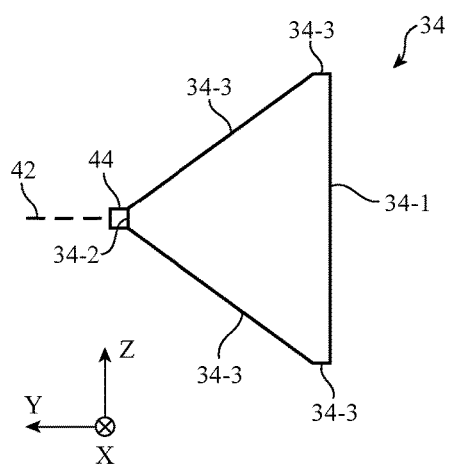
FIG. 16 is a cross-sectional side view of an illustrative electronic component with a cross section that is triangular in shape and has untapered portions in accordance with an embodiment.

Cross-sectional side views of components 34 of different illustrative shapes are shown in FIGS. 13, 14, 15, and 16. As shown in FIG. 13, component 34 may have a front face such as front face 34-1, an opposing rear face such as rear face 34-2, and side surfaces such as surfaces 34-3. Some or all of front face 34-1 may lie flush with outer surface 38 of housing 12-2 (i.e., front face 34-1 of component 34 may form exterior surface 40 of FIG. 7). In the example of FIG. 13, front face 34-1 has larger lateral dimensions (in vertical dimension Z and horizontal dimension X) than rear face 34-2. Side surfaces 34-3 form a tapering shape so that component 34 is wider at the front than at the rear. Side surfaces 34-3 are straight in the cross-sectional side view of FIG. 13. In the illustrative configuration of FIG. 14, side surfaces 34-3 have smoothly tapering curved profiles. FIG. 15 shows how side surfaces 34-3 may progressively narrow component 34 in a step-wise fashion. In the example of FIG. 16, side surfaces 34-3 have portions in which component 34 does not taper and portions in which component 34 tapers. Connector 44 may be mounted on rear surface 34-2 of component 34 or elsewhere in component 34. If desired, other side profiles may be used for component 34 (e.g., tapered and/or non-tapered profiles). The configurations of FIGS. 13, 14, 15, and 16 are shown as examples.

Figure 17:
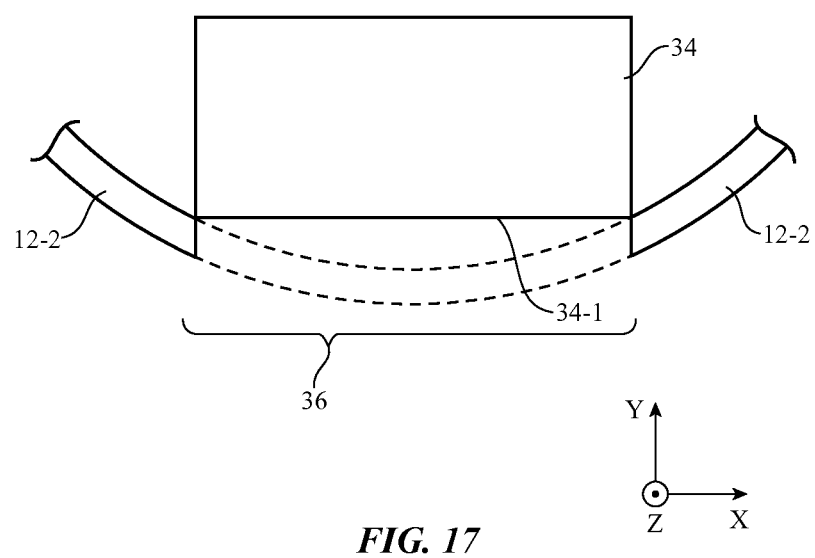
FIG. 17 is a top view of an illustrative component with a flat outer surface that has been mounted in an opening in a cylindrical housing in accordance with an embodiment.
Figure 18:
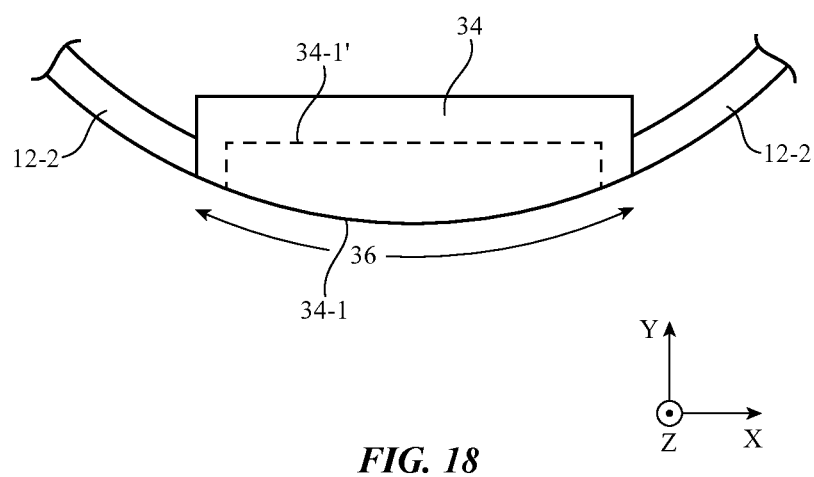
FIG. 18 is a top view of an illustrative component with a curved outer surface that has been mounted in an opening in a cylindrical housing in accordance with an embodiment.

It may be desirable to provide front face 34-1 of component 34 with a surface shape that matches the surface shape of housing wall 12-2. For example, if housing wall 12-2 has a cylindrical shape with a curved (circular) outer surface, component 34 may have a matching curved outer surface. FIG. 17 is a top view of an illustrative configuration in which component 34 has a front surface (surface 34-1) that is planar. As a result, surface 34-1 does not match the curvature of the curved outer surface of cylindrical housing wall 12-2. FIG. 18 shows how component 34 may be provided with a curved outer surface (surface 34-1) that matches the curved outer surface of cylindrical housing wall 12-2. If desired, peripheral edges of surface 34-1 or other portion of surface 34-1 may match the curved surface of cylindrical housing wall 12-2 and other portions (e.g., central portion 34-1') may have other surface shapes (e.g., protruding and/or recessed shapes, planar shapes, dome-shaped configurations, etc.).

Figure 19:
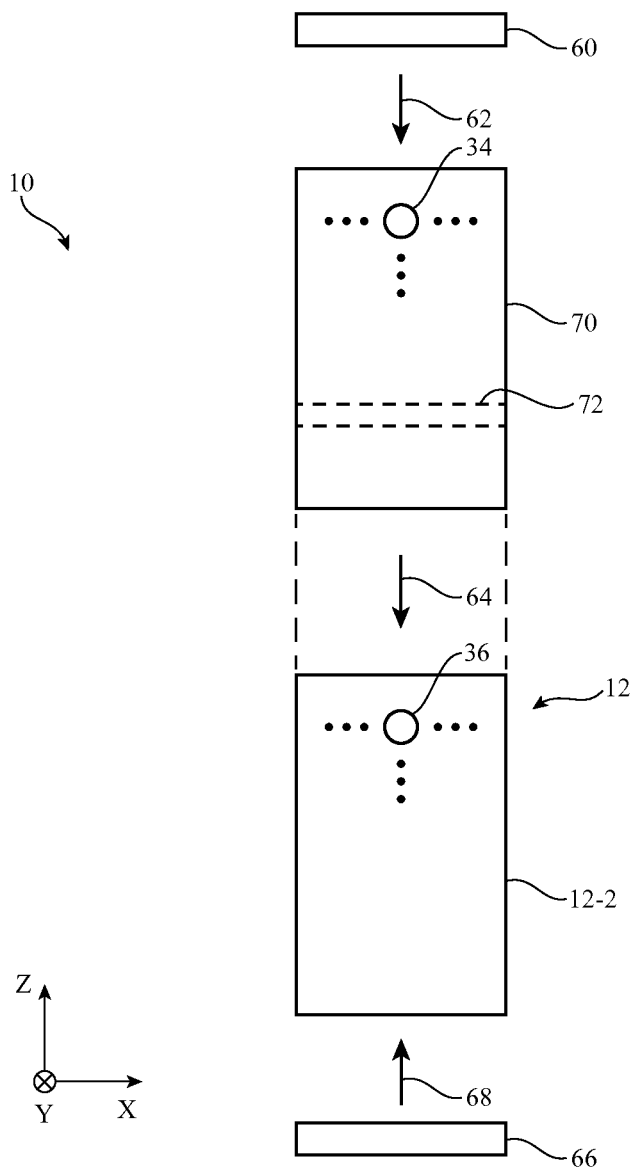
FIG. 19 is an exploded view of an illustrative electronic device containing radially deployed components in accordance with an embodiment.

FIG. 19 is an exploded view of device 10 in an illustrative configuration in which an inner support structure such as support structure 70 is used to support one or more components 34 within housing 12. As shown in FIG. 19, components 34 may, if desired, by formed in an array on the surface of support structure 70 in a pattern that matches an array of openings 36 in housing wall 12-2 of housing 12. Support structure 70 may have a shape that allows support structure 70 and components 34 to be mounted within the interior of housing 12. If, for example, housing 12 has a cylindrical shape or other shape with curved walls 12-2, support structure 70 may have a corresponding cylindrical shape or other shape with matching curved walls. Configurations in which housing 12 and/or support structure 70 have box shapes or other shapes with planar walls may also be used.

The dimensions of support structure 70 may be smaller than the interior dimensions of housing 12 to allow support structure 70 and components 34 to be installed within housing 12. For example, in configurations in which housing 12 is cylindrical in shape, the inner diameter of housing 12 may be larger than the outer diameter of structure 70 and components 34 to ensure that structure 70 and components 34 can be inserted into the interior of housing 12 in direction 64 (e.g., along the longitudinal axis of elongated structures such as housing 12 and support structures 70 of FIG. 19).

If desired, structure 70 may have a hollow interior. One or more inner wall structures such as wall 72 may be used as baffles to separate the interior of structure 70 into separate cavities or inner wall structures such as wall 72 may be omitted. Components such as components 60 and 68 may be mounted to the upper and lower ends of structure 70 and housing 12. Components 60 and 68 may be light-based components such as lamps, light-emitting diodes, or displays, may be input-output components such as buttons or touch sensors, may be input-output ports, may be speakers, microphones, or other audio components, may be printed circuit boards containing integrated circuits and other circuitry, or may be other electrical components. As shown in FIG. 19, component 60 may be installed in the upper end of device 10 (e.g., component 60 may be mounted within an open upper end in a cylindrical inner structure such as structure 70 using a sealed or unsealed mounting arrangement). Component 66 may be installed in the lower end of device 10 (e.g., component 66 may be mounted within an open lower end in a cylindrical inner structure such as structure 70 using a sealed or unsealed mounting arrangement).

When structure 70 (e.g., a hollow tube or other support) is installed within a mating cylindrical cavity in the housing 12, each component 34 may be aligned with a respective one of openings 36. To ensure that each component 34 is properly seated within a respective opening 36, components 34 may be moved outwards using component deployment structures. This type of radial deployment of components 34 may be performed for each component 34 separately or may be performed for one or more groups of multiple components 34 simultaneously.

There may be an air gap between the outer surface of structure 70 and the inner surface of wall 12-2. This air gap may be used to convey sound, may allow air to flow (e.g., when cooling components that generate heat), may be used to allow light to pass, and/or may provide a separation between structure 70 and housing wall 12-2 that facilitates insertion of structure 70 and components 34 into the interior of housing wall 12-2.

Components 60 and 66 may seal the upper and lower ends of the interior of structure 70. For example, in configurations in which structure 70 is a hollow tube having an interior wall such as interior wall 72, structure 70 (and wall 72) may create two cylindrical cavities. Component 60 may be installed within the upper end of tube 70 (i.e., at the upper end of the upper cylindrical cavity) and component 66 may be installed within the lower end of tube 70 (i.e., at the lower end of the lower cylindrical cavity). Other configurations for device 10 may be used if desired (e.g., configurations that use additional components in the interior of tube 70, configurations in which one or both of components 60 and 66 are omitted, etc. The configuration of FIG. 19 is merely illustrative.

Components 34 may be mounted on the exterior of structure 70 directly or using intermediate carrier structures. Components 34 may, for example, be mounted on the exterior of structure 70 using printed circuit boards, using plastic carriers, using dielectric substrates such as plastic support structures or printed circuits that include patterned metal traces for carrying signals to and from components 34, or using other suitable carriers that serve as component substrates. As an example, components 34 may be mounted on carriers formed from elongated strips of dielectric material. Each strip of dielectric material may contain a respective set of components 34.

The elongated carrier strips to which components 34 are mounted may be arranged around the surface of support 70. Each strip may extend vertically (e.g., parallel to the longitudinal axis of a cylindrically shaped support structure 70), may wrap around the circumference of support structure 70 horizontally, and/or may be mounted to structure 70 diagonally or using other suitable mounting arrangements. The carrier structures with which components 34 are supported may be attached to structure 70 using adhesive, screws, threads, engagement features, prongs, springs, clips, or other suitable attachment mechanisms. As an example, structure 70 may have an array of protrusions (e.g., plastic posts, etc.) that extend radially outward from structure 70 and the carrier structures to which components 34 are attached may have an array of recesses that mate with the protrusions. Other types of interlocking features may also be used. The use of posts and mating recesses is merely illustrative.

During assembly of device 10, the carrier structures may be moved outwards to radially deploy multiple components 34 at once. For example, an elongated carrier structure may be moved radially outwards towards wall 12-2, thereby simultaneously moving multiple components 34 outward into respective openings 36 in wall 12-2. Configurations in which component deployment structures are used to individually install components 34 within respective openings 36 may also be used.

Figure 20:
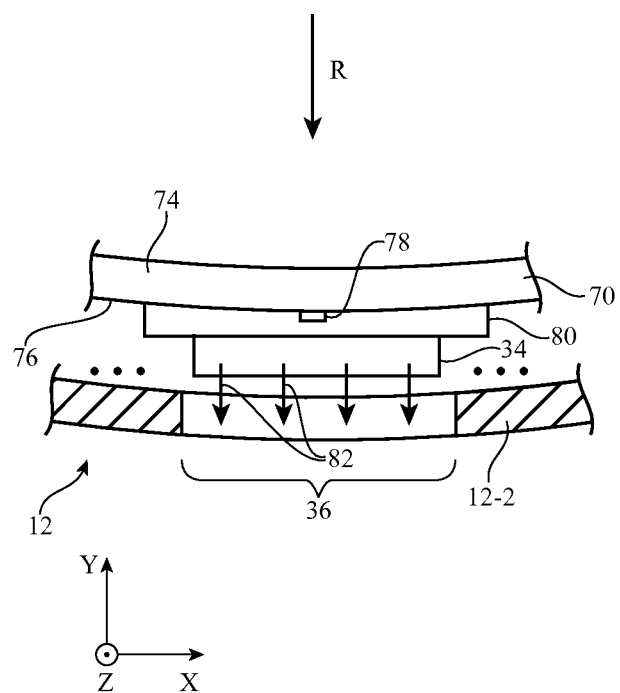
FIG. 20 is a cross-sectional top view of a component being mounted within a housing opening in accordance with an embodiment.

FIG. 20 is a cross-sectional top view of an illustrative carrier structure being used to radially deploy one or more components 34. As shown in FIG. 20, support structure 70 may have outer surface such as outer surface 76 and an opposing inner surface such as inner surface 74. Protrusions such as one or more posts 78 may be formed on outer surface 76 (as an example). Posts 78 may be formed as integral portions of structure 70 or may be separate structures that are attached to structure 70 using adhesive, welds, screws, or other attachment mechanisms. Carrier structure 80 may have corresponding recesses or other features that engage with posts 78. This allows carrier structure 80 to be mounted on surface 76 prior to insertion of structure 70 into the interior of housing 12 (e.g., the recesses or other engagement features on carrier structure 80 may mate with corresponding protrusions 78).

Carrier structure 80 may be a printed circuit (e.g., a rigid printed circuit formed from fiberglass-filled epoxy or other rigid printed circuit board material or a flexible printed circuit formed from a sheet of polyimide or a layer of other flexible polymer), may be a plastic part such as a molded plastic structure, may be a structure formed from glass, a crystalline dielectric, ceramic, or a support structure formed from other suitable materials. Conductive paths for component signals may be embedded within the carrier and/or may be formed on the surface of the carrier structure (e.g., patterned metal traces may be formed in a printed circuit or other substrate, etc.). Components 34 may be mounted to each carrier structure 80 using solder, welds, adhesive, mating engagement structures, screws, or other attachment mechanisms.

As shown in FIG. 20, openings such as opening 36 in housing wall 12-2 may be aligned with respective components such as component 34 on carrier 80 of FIG. 20 when structure 70 is installed within the interior of housing wall 12. There may initially be a radial separation in radial dimension R between outer cylindrical surface 76 of support structure 70 and the opposing inner cylindrical surface of housing wall 12-2. To mount a component such as component 34 satisfactorily within opening 36, that component 34 may be deployed radially outward into opening 36 as shown by arrows 82. During radial deployment (e.g., deployment outward in radial directions from a central axis such as the longitudinal axis of cylindrical housing 12), elastomeric gaskets or other compressible materials may be compressed between each component 34 and an opposing portion of housing wall 12-2 to form seals around each component 34 (e.g., around the circular edge of a circular component, etc.).

Figure 21:
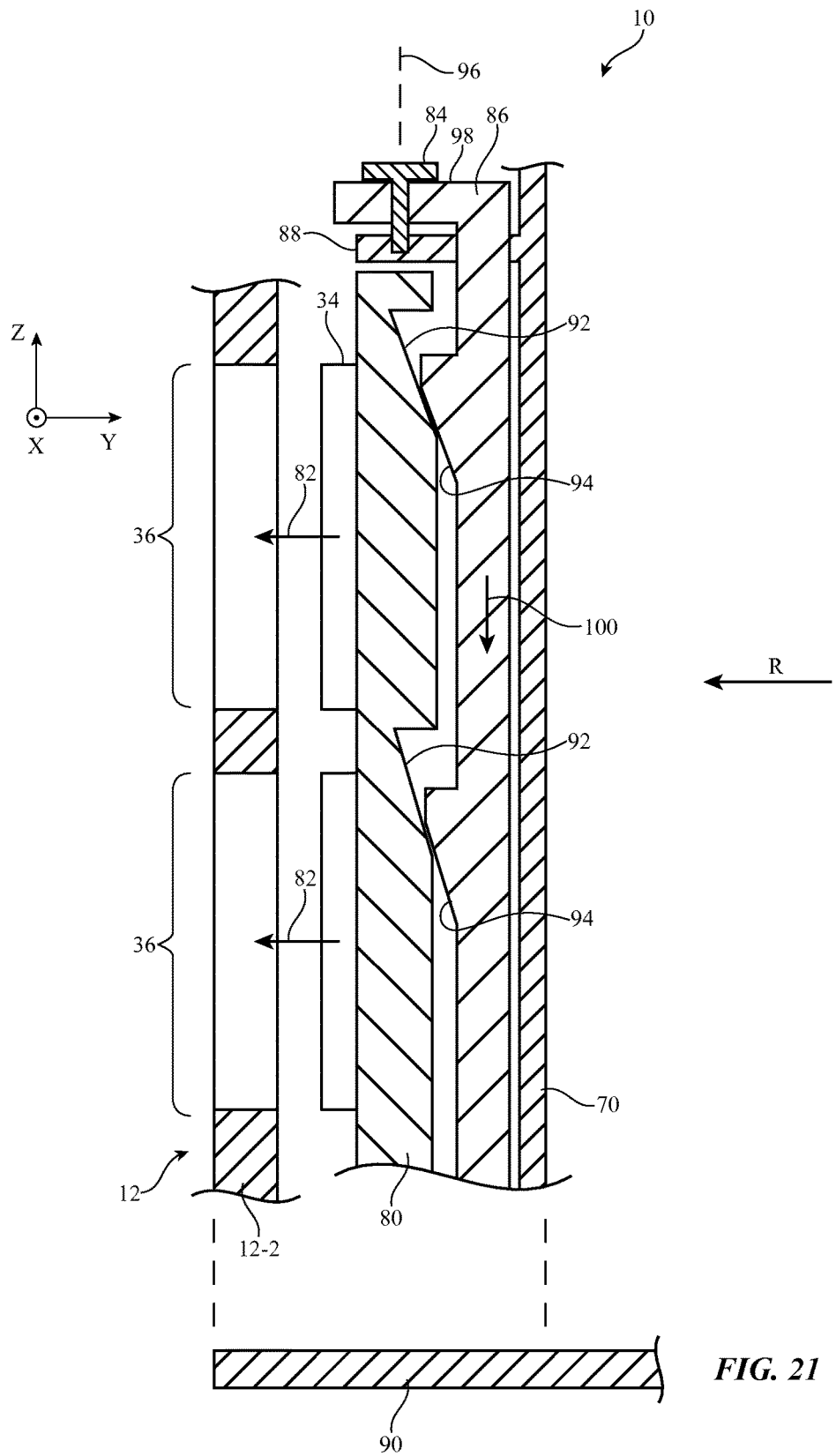
FIG. 21 is a cross-sectional side view of ramp structures in an electronic device that are being used to mount a component within a housing in accordance with an embodiment.

Carriers such as carrier 80 may be elongated strips that run vertically along the surface of structure 70 in vertical dimension Z. If desired, ramp structures may be used to radially deploy components 34 into openings 36. A ramp-based configuration for radially deploying components 34 is shown in FIG. 21. As shown in FIG. 21, components 34 may be mounted on carrier 80 in alignment with openings 36 in housing wall 12-2. Each carrier 80 may be elongated along vertical dimension Z. A plurality of components 34 may be mounted along carrier 80 in dimension Z. The width of carrier 80 in lateral dimension X may be sufficient to support a single component 34 or to support multiple components 34.

A plurality of carriers 80 may be mounted around the periphery of support structure 70 (e.g., to cover some or all of structure 70 with an array of components 34). Portions of a single illustrative carrier 80, support structure 70, and housing 12 are shown in FIG. 21. As shown in FIG. 21, carrier structure 80 may have ramped surfaces 92 formed from angled (ramped) portions of carrier 80 adjacent to elongated member 86. Elongated member 86 may be a translating member (e.g., a member that moves vertically in the example of FIG. 21). Elongated member 86 may have corresponding ramped surfaces 94 formed from ramped portions of elongated member 86. Configurations in which member 86 has ramps and carrier 80 has mating structures that are not ramped and in which carrier 80 has ramps and member 86 has mating structures that are not ramped may also be used. The configuration of FIG. 21 in which the ramped structures of device 10 are formed on both member 86 and carrier 80 is merely illustrative.

Screw 84 of FIG. 21 may be rotated about axis 96 when it is desired to radially deploy components 34. The shaft of screw 84 may be received within threaded portions of structure 88. Structure 88 may have a position that is fixed relative to support structure 70. For example, structure 88 may be an extended portion of structure 70 or may be attached to structure 70. Support structure 70 and housing 12 (e.g., housing wall 12-2) may be attached to each other using structures such as base 90, by attaching extensions of structure 70 (e.g., extension 88) to the inner surface of housing wall 12-2, etc.

The lower surface of the head of screw 84 bears against upper surface 98 of elongated translating member 86 as screw 84 is screwed in a clockwise direction about axis 96. As screw 84 is screwed into portion 88 of support structure 70 or other structure that is fixed relative to support structure 70, the lower surface of screw 84 pushes surface 98 of elongated member 86 downwards in direction 100. As elongated member 86 is pushed downwards and translates in direction 100, ramp surfaces 94 of elongated member 86 bear against mating ramp surfaces 92 of carrier structure 80. The inner surface of structure 86 may be bear against the outer surface of support structure 70. Vertical movement of carrier 80 is constrained (e.g., due to attachment of carrier 80 to support structure 70 with posts 78 or because the bottom of carrier 80 bears against base structure 90 or other portions of device. This causes ramp surfaces 94 and 92 to interact with each other. Downwards movement of elongated member 100 and ramp surfaces 94 relative to carrier structure 80 and ramp surfaces 92 therefore pushes carrier structure 80 and components 34 on carrier structure 80 radially outwards in direction 82. Screw 84 can be screwed until elongated member 86 has moved sufficiently downward to push components 34 against housing 12-2 and openings 36. Mounting components 34 in openings 36 in this way may be particularly efficient in configurations in which more than one component 34 is mounted to each carrier 80. If desired, an elastomeric gasket (e.g., a ring-shaped gasket) may be interposed between the edge of each component 34 and an opposing surface of housing wall 12-2, so that components 34 each form a seal with housing wall 12-2.

Figure 22:
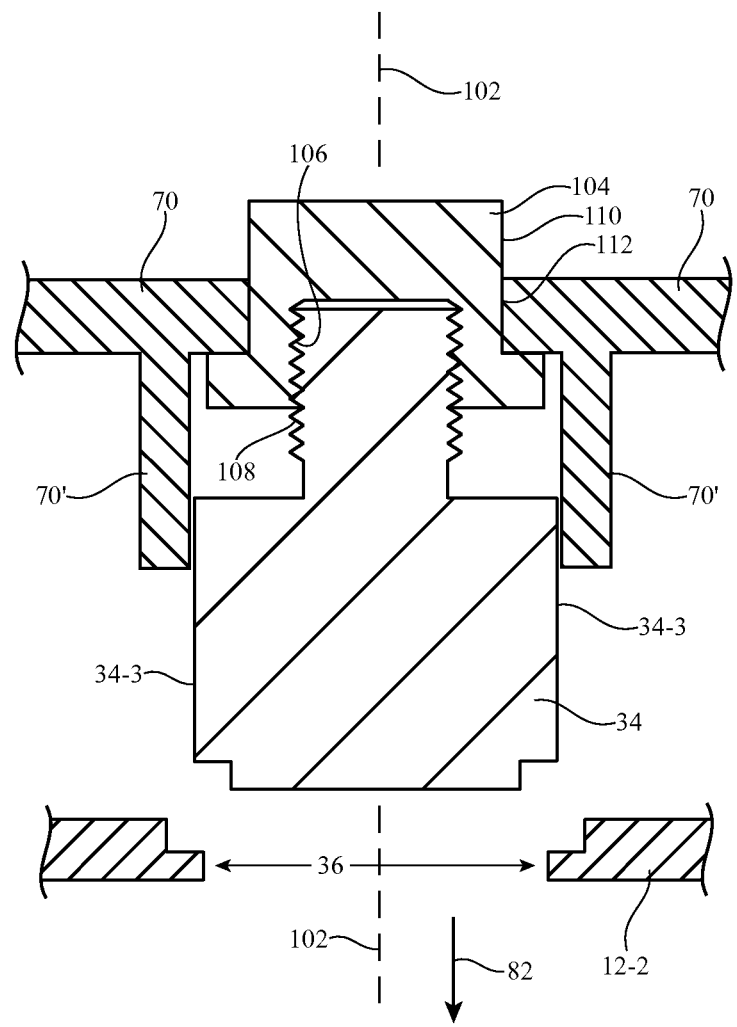
FIG. 22 is a cross-sectional top view of an illustrative component with threads prior to being mounted in an opening in a housing in accordance with an embodiment.
Figure 23:
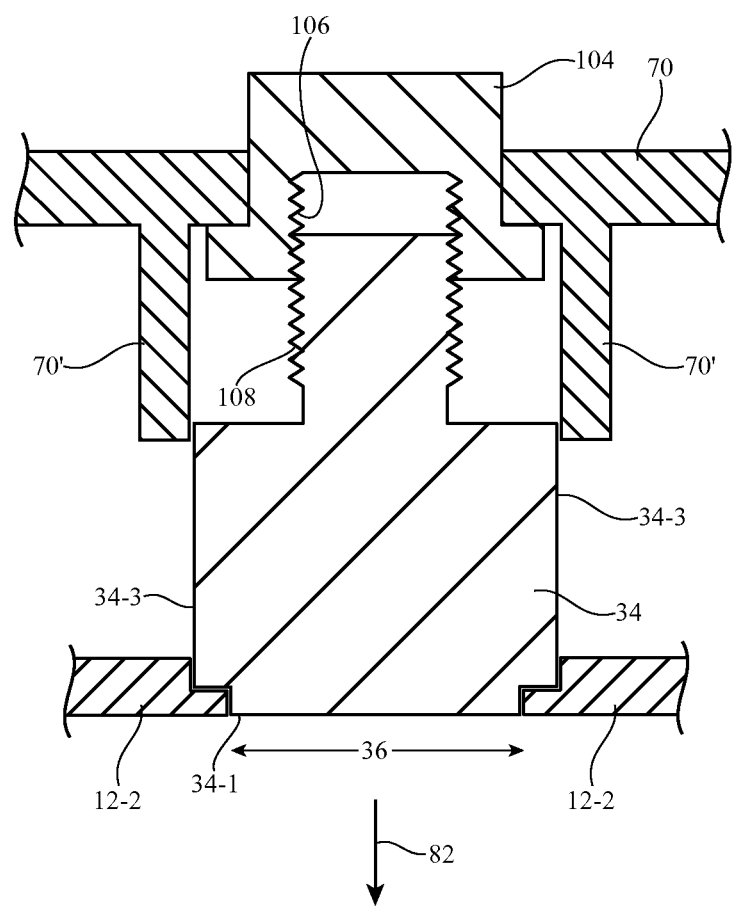
FIG. 23 is a cross-sectional top view of the illustrative component of FIG. 22 following rotation of a component deployment structure to mount the component in the opening in accordance with an embodiment.

Components 34 may also be radially deployed by screwing a deployment structure in a way that engages threads on components 34. This type of arrangement is shown in FIGS. 22 and 23. In the configuration of FIG. 22, component 34 has just been installed within the interior of housing wall 12-2 and has not yet been radially deployed. Component 34 may be mounted on a support structure 70 as part of an array of components 34, as described in connection with FIG. 19 (e.g., support structure 70 may be a hollow tube and housing wall 12-2 may be a hollow cylindrical wall that has an interior sufficiently large to accept support structure 70 and components 34). In the configuration of FIG. 23, component 34 has been deployed radially outward in direction 82 into opening 36 in housing wall 12-2.

As shown in FIG. 22, component 34 may be deployed outward in direction 82 using a component deployment structure such as nut 104. Peripheral surface 100 of nut 104 may have a circular shape when viewed along axis 102. Nut 104 may extend through a circular opening such as circular opening 112 in support structure 70. The circular outline of nut 104 and the corresponding circular shape of opening 112 allow nut 104 to rotate about rotational axis 102. Nut 104 has threads 106 that engage with mating threads 108 on component 34.

Support structure 70 or other structures in device 10 that are fixed relative to housing 12 may have stationary component rotation prevention structures such as structures 70'. Rotation prevention structures 70' may be integral portions of support structure 70 that extend outwardly on either side of component 34 (as shown in FIG. 22), may be integral portions of support structure 70 that extend outwardly above and below component 34, or may be other protrusions from support structure 70 that rest along the surfaces of component 34. Rotation prevention structures 70' may also be attached to other portions of device 10 that do not rotated with nut 104 instead of or in addition to being attached to support structure 70. The example of FIG. 22 is merely illustrative.

Component 34 may have sidewall portions that define planar surfaces 34-3 or other surfaces that interact with rotation prevention structures 70'. In the example of FIG. 22, the inner surfaces of rotation prevention structures 70' bear against surfaces 34-3 of component 34 and prevent component 34 from rotating about axis 102. Due to this rotational constraint of component 34, rotation of nut 104 will cause threads 106 and 108 to engage and move component 34 outward in direction 82 as nut 104 is rotated about axis 102. Upon sufficient rotation of nut 104, component 34 will be mounted within opening 36, as shown in FIG. 23.

Figure 24:
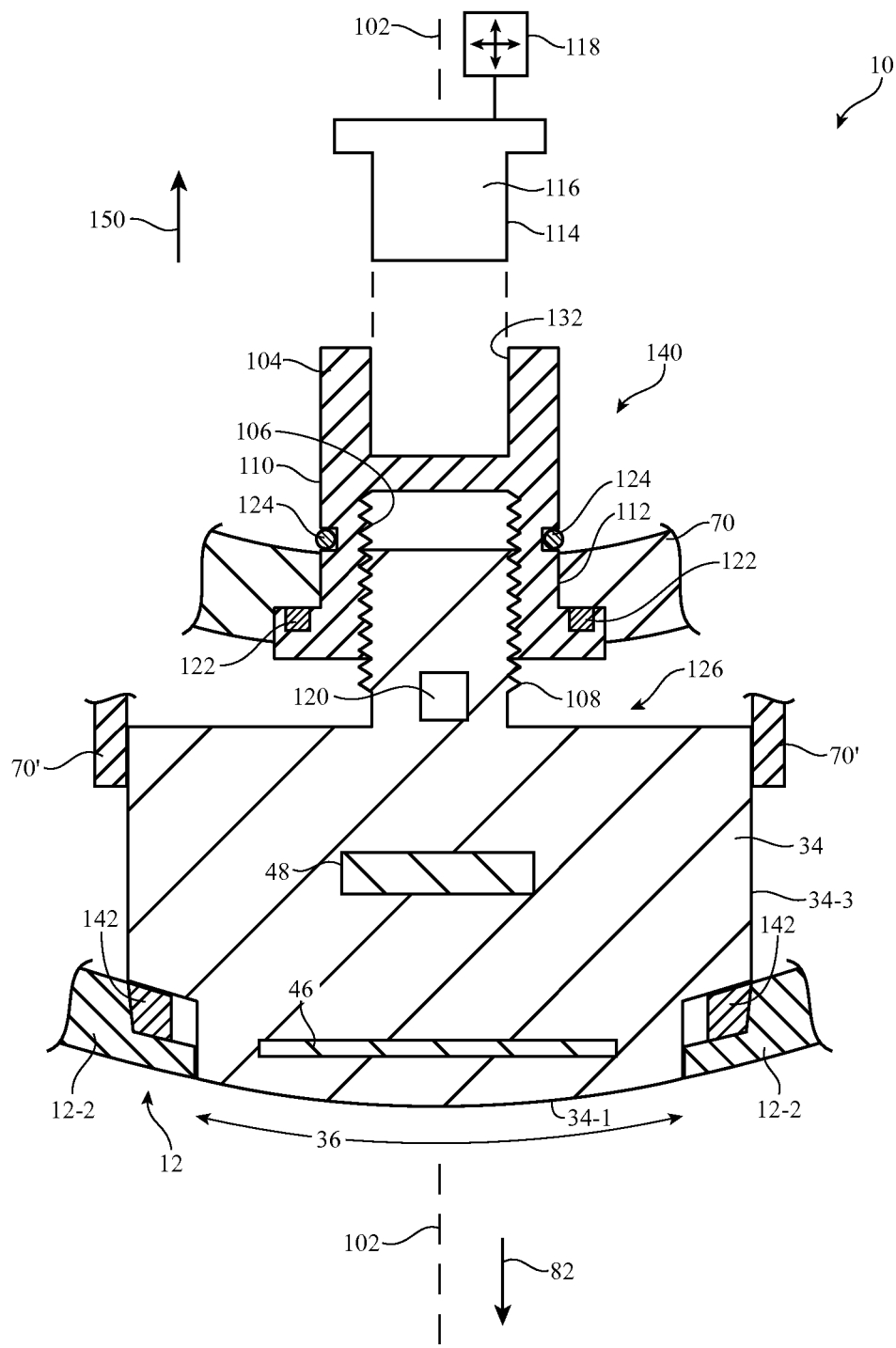
FIG. 24 is a cross-sectional top view of an illustrative component that has been mounted in a housing using a rotating component deployment structure in accordance with an embodiment.

FIG. 24 shows how a nut driver or other tool may rotate a nut-based component deployment structure such as nut 104 to radially deploy component 34 into opening 36 in housing 12. Nut 104 may be rotated about rotational axis 102 using nut driver 116. Nut driver 116 may be positioned and rotated manually and/or using computer-controlled positioning equipment 118. Nut driver 116 may have an outer surface shape 114 that mates with inner surface 132 of nut 104. As an example, outer shape 114 may be hexagonal (when viewed along axis 102) and inner surface 132 may be formed from a corresponding hexagonal recess within nut 104.

Outer surface 110 of nut 104 may be circular to permit nut 104 to rotate within circular opening 112 of support structure 70. Threads 106 on the inner surface of nut 104 may engage corresponding threads 108 on the outer surface of component 34. Rotation prevention structures 70' may prevent component 34 from rotating about axis 102, as described in connection with structures 70' in FIGS. 22 and 23.

As nut 104 is rotated about axis 102, component 34 is driven outwardly in direction 82 into opening 36. An elastomeric gasket such as elastomeric ring-shaped gasket 142 may be compressed between the peripheral edges of component 34 and the portions of housing wall 12-2 around opening 36. This seals component 34 to housing wall 12-2. Nut 104 may be rotated until component 34 is being pushed outwardly in direction 82 with sufficient force to compress gasket 142. The restoring force from gasket 142 causes nut 104 to be biased inwardly in direction 150. This causes nut 104 to compress an elastomeric gasket such as ring-shaped gasket 122 between inwardly facing portions of nut 104 and outwardly facing portions of support structure 70. Gasket 122 seals nut 104 to support structure 70. Retaining ring 124 may be used to help retain nut 104 in support structure 70 during assembly.

With the seals formed by gaskets 142 and 122, the exterior of housing 12 is isolated from the portion of device 10 between support structure 70 and housing wall 12-2. This cavity (shown as region 126 in FIG. 24) may be filled with air. If desired, component 34 may have internal components 46 and 48 (e.g., light-based components, sensor components, audio components, etc.) that benefit from being vented to interior region 126 between support structure 70 and housing 12. Accordingly, one or more openings such as air vent 120 may be formed in component 34 to vent the interior of component 34 to surrounding air regions such as region 126.

Gasket 122 seals interior region 140 in support structure 70 from surrounding regions such as region 126 between support structure 70 and housing wall 12-2. With this type of arrangement, region 140 is an isolated cylindrical air-filled cavity and region 126 is an isolated annular air-filled cavity that surrounds cylindrical support structure 70. Components such as components 60 and 66 may be mounted on the ends of support structure 70 (e.g., in positions that expose one side of each component to interior 140 and an opposing side of each component to the exterior of device 10). If desired, wall structures such as wall 72 of FIG. 19 may separate interior cavity 140 into upper and lower portions. In this type of arrangement, component 60 may be in communication with the upper air cavity and component 66 may be in communication with the lower air cavity. Components 34 may vent air to region 126 without venting any air to region 140 (i.e., regions 140 and 126 may be isolated from each other).

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
   a housing having a housing wall defining an opening;
   a carrier structure disposed within the housing;
   an electrical component mounted on the carrier structure and aligned with the opening; and
   a translating member that bears against the carrier structure along a ramped surface and moves in a first direction when translated to push the electrical component in a second direction substantially orthogonal to the first direction and into the opening, the carrier structure being positioned between the translating member and the housing.

2. The electronic device defined in claim 1 further comprising a screw, wherein rotation of the screw translates the translating member.

3. The electronic device defined in claim 2 wherein the opening comprises one of a plurality of openings in the housing wall and wherein the electrical component comprises one of a plurality of electrical components mounted on the carrier structure that are respectively aligned with the openings.

4. The electronic device defined in claim 3 wherein the carrier structure comprises a plurality of ramped surfaces.

5. The electronic device defined in claim 4 wherein the carrier structure is an elongated carrier structure and wherein the translating member comprises an elongated translating member with a plurality of ramped portions that bear against the ramped surfaces of the carrier structure.

6. The electronic device defined in claim 5 wherein the elongated carrier structure comprises one of a plurality of elongated carrier structures each carrying a corresponding set of the electrical components, the electronic device further comprising a support structure to which a plurality of the elongated carrier structures are mounted.

7. The electronic device defined in claim 6 wherein the support structure is a cylindrical support structure having a longitudinal axis and wherein the elongated carrier structures extend parallel to the longitudinal axis.

8. The electronic device defined in claim 7 wherein the housing wall is cylindrical.

9. The electronic device defined in claim 1 wherein the electrical component comprises a component selected from the group consisting of: a light source, a light detector, a speaker, and a sensor.

10. The electronic device defined in claim 9 wherein the housing wall is a curved housing wall and wherein the opening comprises one of a plurality of openings sized to receive electrical components.

11. An electronic device, comprising:
    a housing having a curved housing wall defining a housing wall opening;
    an electrical component aligned with the housing wall opening and having threads;
    a support structure within the housing that has a support structure opening; and
    a nut extending through the support structure opening, the nut defining a threaded aperture engaged by the threads of the electrical component, wherein rotation of the nut causes interaction between a portion of the nut defining the threaded aperture and the threads of the electrical component that pushes the electrical component towards the housing wall opening.

12. The electronic device defined in claim 11 wherein the curved housing wall is a cylindrical housing wall.

13. The electronic device defined in claim 12 wherein the support structure comprises a cylindrical support structure within an interior portion of the housing defined by the cylindrical housing wall.

14. The electronic device defined in claim 13 further comprising rotation prevention structures that bear against the electrical component so the electrical component does not rotate when the nut is rotated.

15. The electronic device defined in claim 13 wherein the electrical component has an air vent that vents to an air-filled region between the curved housing wall and the support structure.

16. The electronic device defined in claim 15 wherein the air-filled region comprises an annular region that surrounds the cylindrical support structure.

17. The electronic device defined in claim 16 wherein the cylindrical support structure is hollow and includes a cylindrical air-filled cavity.

18. The electronic device defined in claim 17 wherein the electrical component comprises a component selected from the group consisting of: a light source, a light detector, a speaker, and a sensor.

19. The electronic device defined in claim 18 further comprising an additional electrical component, wherein the additional electrical component is mounted at an end of the cylindrical support structure in communication with the cylindrical cavity.

20. An electronic device, comprising:
    a housing having a cylindrical housing wall with an array of housing wall openings;

a hollow cylindrical support structure within the housing, wherein the cylindrical housing wall and the hollow cylindrical support structure are separated by an annular region of air;

a plurality of electrical components each aligned with a respective one of the housing wall openings; and radial deployment structures that press the plurality of electrical components radially outward into the respective housing wall openings.

21. The electronic device defined in claim 20 further comprising ring-shaped gaskets that seal the electrical components to the cylindrical housing wall.

22. The electronic device defined in claim 21 wherein the electrical components comprise components selected from the group consisting of: light sources, light detectors, speakers, and sensors.

* * * * *